US008040068B2

(12) United States Patent
Coumou et al.

(10) Patent No.: US 8,040,068 B2
(45) Date of Patent: Oct. 18, 2011

(54) RADIO FREQUENCY POWER CONTROL SYSTEM

(75) Inventors: David J. Coumou, Webster, NY (US); Paul Eyerman, Penfield, NY (US); Carl Ioriatti, Victor, NY (US); William Stenglein, Churchville, NY (US); Larry J. Fisk, II, West Henrietta, NY (US); Aaron Radomski, Wyoming, NY (US); Richard Pham, San Jose, CA (US)

(73) Assignee: MKS Instruments, Inc., Andover, MA (US)

( * ) Notice: Subject to any disclaimer, the term of this patent is extended or adjusted under 35 U.S.C. 154(b) by 407 days.

(21) Appl. No.: 12/366,274

(22) Filed: Feb. 5, 2009

(65) Prior Publication Data

US 2010/0194195 A1  Aug. 5, 2010

(51) Int. Cl.
*H05H 1/46* (2006.01)
*H01J 37/32* (2006.01)

(52) U.S. Cl. .............................. 315/111.21; 315/111.41
(58) Field of Classification Search ............. 315/111.21, 315/111.41, 326, 261; 219/121.43, 121.54; 324/464, 520; 118/723 I, 723 R
See application file for complete search history.

(56) References Cited

U.S. PATENT DOCUMENTS

| | | | |
|---|---|---|---|
| 5,116,482 A | 5/1992 | Setoyama et al. | |
| 5,473,291 A | 12/1995 | Brounley | |
| 5,556,549 A | 9/1996 | Patrick et al. | |
| 5,654,679 A | 8/1997 | Mavretic et al. | |
| 6,020,794 A | 2/2000 | Wilbur | |
| 6,707,255 B2 | 3/2004 | Coumou et al. | |
| 7,602,127 B2 * | 10/2009 | Coumou | 315/111.21 |
| 2002/0185227 A1 | 12/2002 | MacGearailt | |
| 2006/0220656 A1 | 10/2006 | Tanaka et al. | |
| 2006/0232471 A1 | 10/2006 | Coumou | |
| 2007/0139122 A1 | 6/2007 | Nagarkatti et al. | |
| 2008/0227420 A1 | 9/2008 | Choueiry et al. | |

FOREIGN PATENT DOCUMENTS

| | | |
|---|---|---|
| DD | 295061 B5 | 11/1995 |
| DE | 102006052061 A1 | 5/2008 |
| DE | 202007017015 U1 | 6/2008 |
| DE | 102007011230 A1 | 9/2008 |
| EP | 1589793 A1 | 10/2005 |
| JP | 2002110566 A | 4/2002 |

OTHER PUBLICATIONS

British Search Report for British Application No. GB1001310.0 dated Jun. 1, 2010.
German Office Action for German Patent App No. 102010005799.1 dated Jul. 4, 2011 and English translation.

* cited by examiner

*Primary Examiner* — Daniel D Chang
(74) *Attorney, Agent, or Firm* — Harness, Dickey & Pierce, P.L.C.

(57) ABSTRACT

A radio frequency (RF) system includes a control module that allocates M predetermined frequency intervals. The system also includes N RF sources that each applies first RF power to electrodes within a plasma chamber at frequencies within an assigned respective one of the M predetermined frequency intervals. The N RF sources also each respond to second RF power including feedback from the plasma chamber. The N RF sources each include a processing module that adjusts the first RF power based on the second RF power and the respective one of the M predetermined frequency intervals. M and N are integers greater than 1.

46 Claims, 6 Drawing Sheets

RADIO FREQUENCY POWER CONTROL SYSTEM

FIELD

The present disclosure relates to radio frequency (RF) power exchanges between a RF source and a plasma chamber. More particularly, the present disclosure relates to minimizing effects of distortion from the plasma chamber on RF feedback signals.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Referring now to FIG. 1, a tool 10 used in a deposition process for solar device manufacturing may provide radio frequency (RF) power to a chamber 16. The chamber 16 may enclose powered electrodes 19-1, . . . 19-$i$, . . . , and 19-N (referred to as electrodes 19) and grounded electrodes 20-1, . . . 20-$i$, . . . , and 20-N (referred to as electrodes 20) associated with respective plasma sources 21-1, . . . , 21-$i$, . . . , and 21-N (referred to as plasma sources 21).

The tool 10 may include RF sources 22-1, . . . 22-$i$, . . . , and 22-N (referred to as RF sources 22) that transmit the RF power via transmission lines 24-1, . . . 24-$i$, . . . , and 24-N (referred to as transmission lines 24). The transmission lines 24 communicate with matching networks 26-1, . . . 26-$i$, . . . , and 26-N (referred to as matching networks 26) that provide the RF power to respective electrodes 20. RF sensors 28-1, . . . 28-$i$, . . . , and 28-N (referred to as RF sensors 28) communicate with the transmission lines 24. The RF sensors 28 may provide a reading of received RF power ($\bar{R}$) that is reflected from the plasma chamber 16 and received by the RF sources 22. The RF sensors 28 may also provide a reading of forward RF power ($\vec{F}$) that is applied to the plasma chamber 16. Similarly, voltage/current sensors may be used instead of RF sensors 28 to detect voltage and current signals on the transmission lines.

In operation, RF discharges from forward RF power from multiple RF sources 22 may couple through electromagnetic (EM) interaction within the chamber 16 because the electrodes 19, 20 may share a common vacuum and/or ground. RF sensors within the RF sources 22 (not shown) may detect the coupled RF discharges and feed them back so that they are received in corresponding RF sources 22. The reflected RF power may therefore include RF feedback from the plasma chamber 16 that is affected by distortion, such as crosstalk, caused by RF signals from multiple RF sources 22 communicating with multiple electrodes 19, 20 in a plasma chamber 16.

In order to effectively execute a plasma process, it may be desirable to precisely control forward RF power based on reflected RF power/feedback. For example, strict requirements to control forward RF power have evolved as the complexity of solar device manufacturing processes has increased. Consequently, various control techniques are employed to monitor the forward and reflected power.

For example, a typical frequency tuning method operates as follows: the RF sources 22 are turned on and all have a frequency at a starting point, preferably within the same RF band. The RF sources 22 supply forward power to the plasma chamber. A portion of the forward power is reflected from the plasma chamber 16. The reflected power is measured, and the magnitude of the reflected power is stored in memory as received signals. The RF sources 22 then change the RF frequency in one direction. The RF sources 22 again measure reflected power, and compare it with the stored magnitude from the previous measurement.

Based on the change in reflected power, the RF sources 22 again move the frequency. If there is a decrease in reflected power, the frequency is moved in the same direction; if there is an increase in reflected power, then the frequency is moved in the opposite direction. This is continued until the lowest possible reflected power is achieved.

SUMMARY

A radio frequency (RF) system includes a control module that allocates M predetermined frequency intervals. The system also includes N RF sources that each applies first RF power to electrodes within a plasma chamber at frequencies within an assigned respective one of the M predetermined frequency intervals. The N RF sources also each respond to second RF power including feedback from the plasma chamber. The N RF sources each include a processing module that adjusts the first RF power based on the second RF power and the respective one of the M predetermined frequency intervals. M and N are integers greater than 1.

In other features, a RF system includes a control module that allocates M predetermined frequency intervals. The system also includes a first tunable RF source that maintains a first set point for delivered load power at a first frequency based on first power delivered to a first electrode in a load, first feedback from the load, and an assigned first of the M predetermined frequency intervals. The system also includes a second tunable RF source that maintains a second set point for delivered load power at a second frequency based on second power delivered to a second electrode in the load, second feedback from the load, and a second of the M predetermined frequency intervals. M is an integer greater than 1.

In other features, a method for operating a RF system includes allocating M predetermined frequency intervals. The method also includes applying N first RF power signals to electrodes within a plasma chamber each at frequencies within an assigned respective one of the M predetermined frequency intervals. The method also includes receiving feedback from the plasma chamber. The method also includes adjusting the N first RF power signals based on the feedback and the respective one of the M predetermined frequency intervals. M and N are integers greater than 1.

In other features, a method for operating a RF system includes allocating M predetermined frequency intervals. The method also includes actively maintaining a first set point for delivered load power at a first frequency based on first power delivered to a first electrode in a load, first feedback from the load, and a first of the M predetermined frequency intervals. The method also includes actively maintaining a second set point for delivered load power at a second frequency based on second power delivered to a second electrode in the load, second feedback from the load, and an assigned second of the M predetermined frequency intervals. M is an integer greater than 1.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

Figure 1:
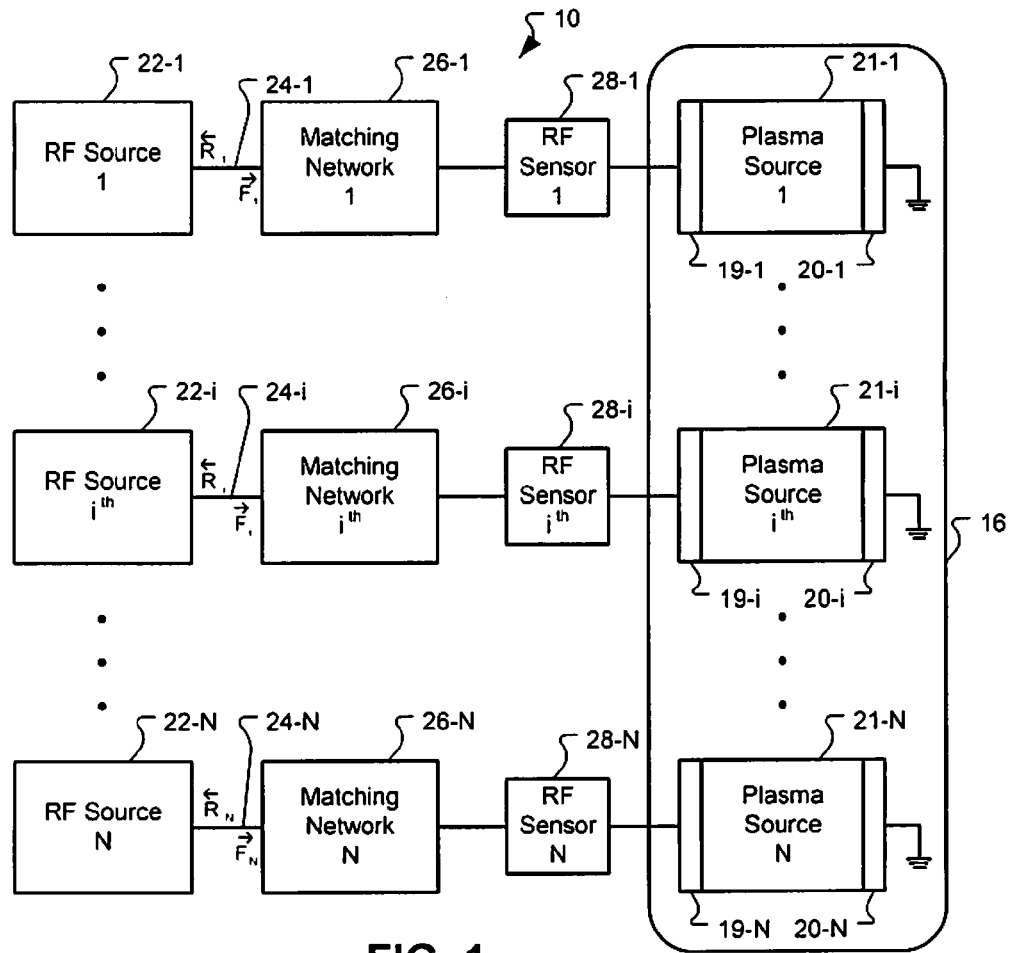
FIG. 1 is a block diagram of an exemplary radio frequency (RF) system, according to the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

A tool that delivers radio frequency (RF) power to a load from multiple RF sources is included in the present disclosure. The tool includes one or more processing modules that reduce distortion, such as crosstalk, within received RF power ($\bar{R}$) reflected from the load based on delivered or forward RF power ($\bar{F}$) from the RF sources. A control module or tool operator may selectively allocate frequency intervals for the RF sources. The processing modules may reduce distortion based on the frequency intervals.

Since crosstalk may occur between multiple electrodes in the load, the additive distortion in the reflected signal, e.g. reflected signal $R_i$ for the ith RF source, is an accumulation of k of N sources contributing to this distortion:

$$R_i = Rev_i(t)\cos(\omega_i t + \alpha_i(t)) + \sum_{\forall k \neq i} Rev_k(t)\cos(\omega_k t + \beta_k(t)).$$

$Rev_i(t)\cos(\omega_i t + \alpha_i(t))$ corresponds to the ith reverse base signal for the ith RF source, and $$\sum_{\forall k \neq i} Rev_k(t)\cos(\omega_k t + \beta_k(t))$$

corresponds to the sum of distortions from the other k RF signals added to the base signal for the ith RF source. The corresponding Fourier Transform of $R_i$ at a particular instance in time (t):

$$\Im[R_i] = \frac{Rev_i}{2}[e^{j\alpha_i}\partial(f - f_i) + e^{-j\alpha_i}\partial(f + f_i)] + \sum_{\forall k \neq i} \frac{Rev_k}{2}[e^{j\beta_i}\partial(f - f_k) + e^{j\beta_k}\partial(f + f_k)].$$

$\Im[R_i]$ therefore provides the corresponding frequency domain representation of $R_i$ within the range of frequencies (f) from $f-f_i$ to $f+f_i$ for the ith received base signal and $f-f_k$ to $f+f_k$ for the other k RF signals.

Figure 2A:
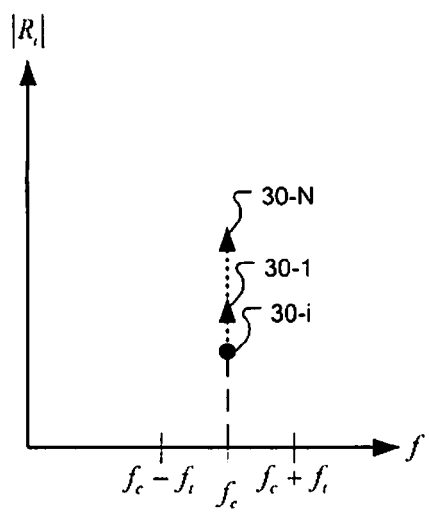
FIGS. 2A-2B illustrate spectral diagrams without selective frequency distribution.
Figure 2B:
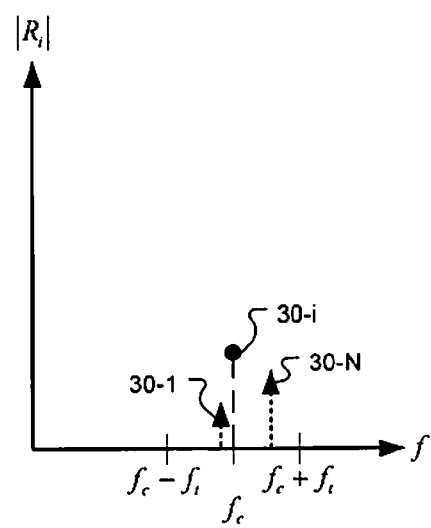

Referring now to FIGS. 2A-2B, conventional spectral diagrams are illustrated where the frequency of the multiple RF sources is constrained to a narrow region $f_c-f_t$ to $f_c+f_t$, e.g. 50 ppm of the designated center frequency ($f_c$). In FIG. 2A, two exemplary in-band spectral components 30-1, 30-N are illustrated that are coupled to and that interfere with the received signal [$R_i$] of the ith RF source. For example, a spectral component of interest 30-$i$ that corresponds to the actual power reflected from the load may be vertically aligned with interfering spectral components 30-1, 30-N having the same frequency value. In this instance, it may be difficult to discern the spectral component of interest 30-$i$ from the accumulative sum of all spectral components.

Similarly, in FIG. 2B, interfering spectral components 30-1, 30-N may not share the same frequency value and may be distributed to have frequency values within the operating bandwidth ($f_c-f_t$ to $f_c+f_t$). If the frequency variation between RF signals is within a prescribed narrow frequency range, the reflected spectral component of interest 30-$i$ may be conflated with other in-band spectral components 30-1, 30-N.

The conventional frequency distributions of FIGS. 2A and 2B may therefore contribute to inaccurate analysis of reflected signals and thus inaccurate power adjustments within the corresponding RF sources.

Figure 3A:
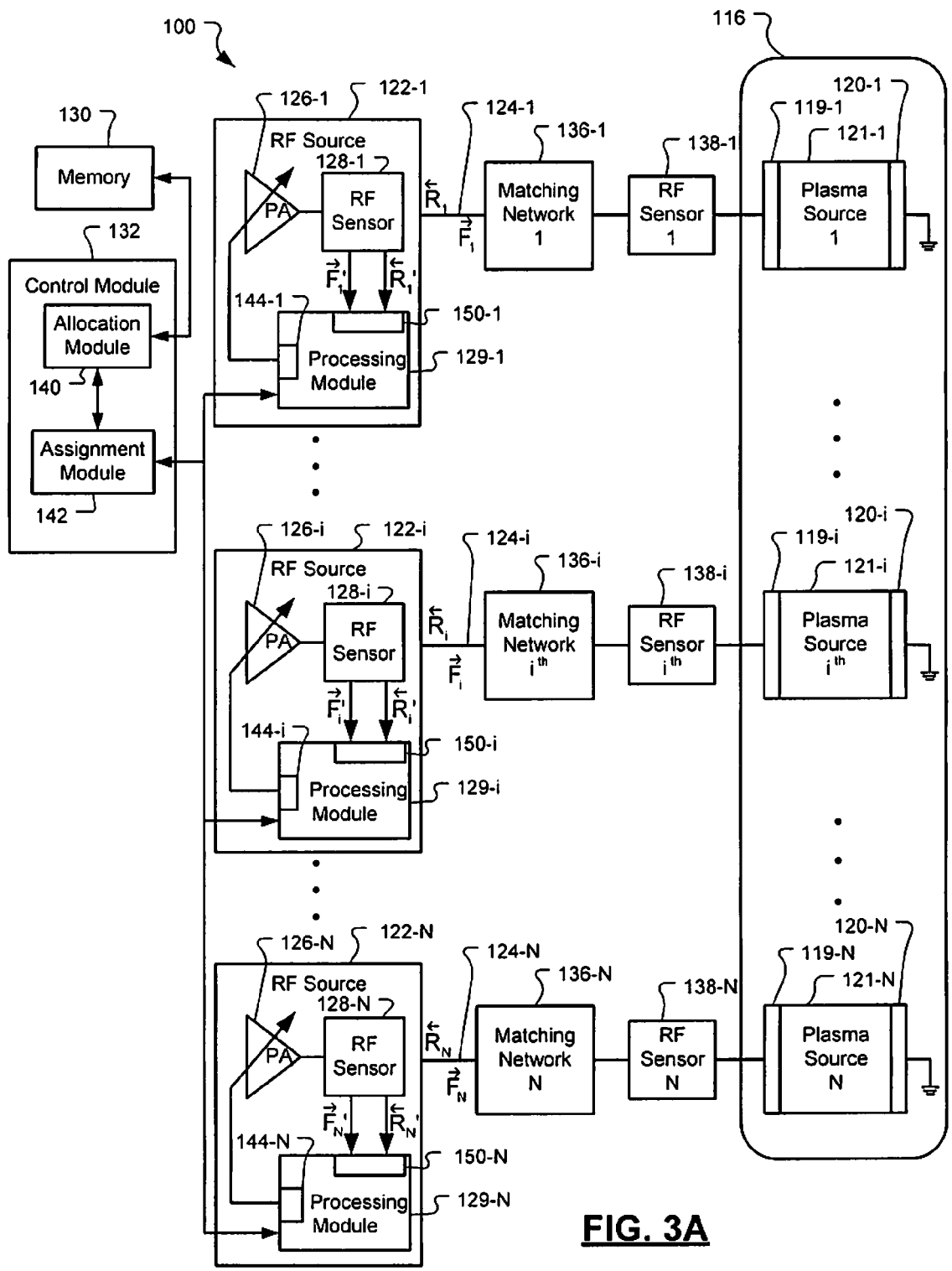
FIGS. 3A-3C are block diagrams of exemplary RF systems, according to the present disclosure.
Figure 3B:
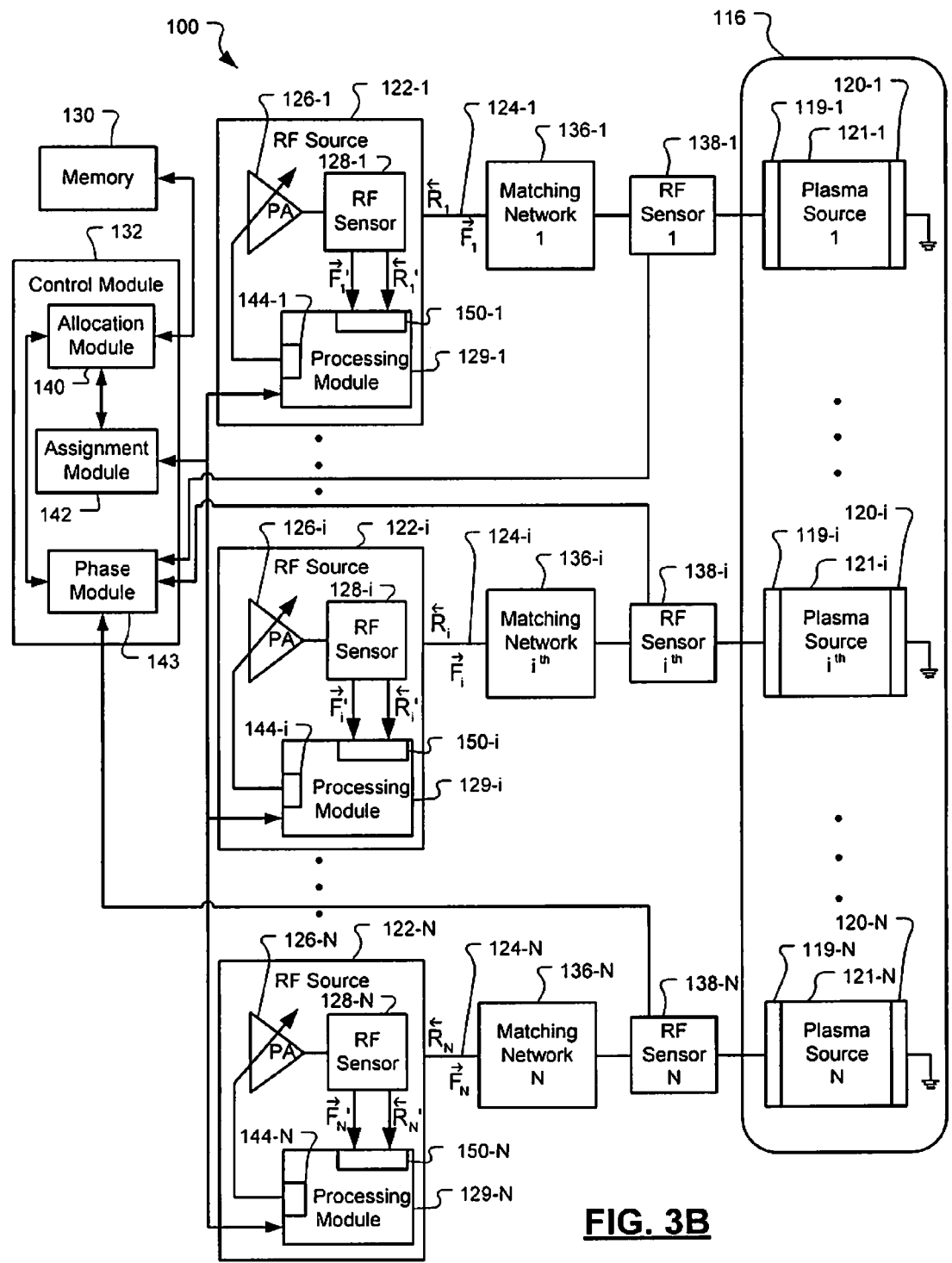
Figure 3C:
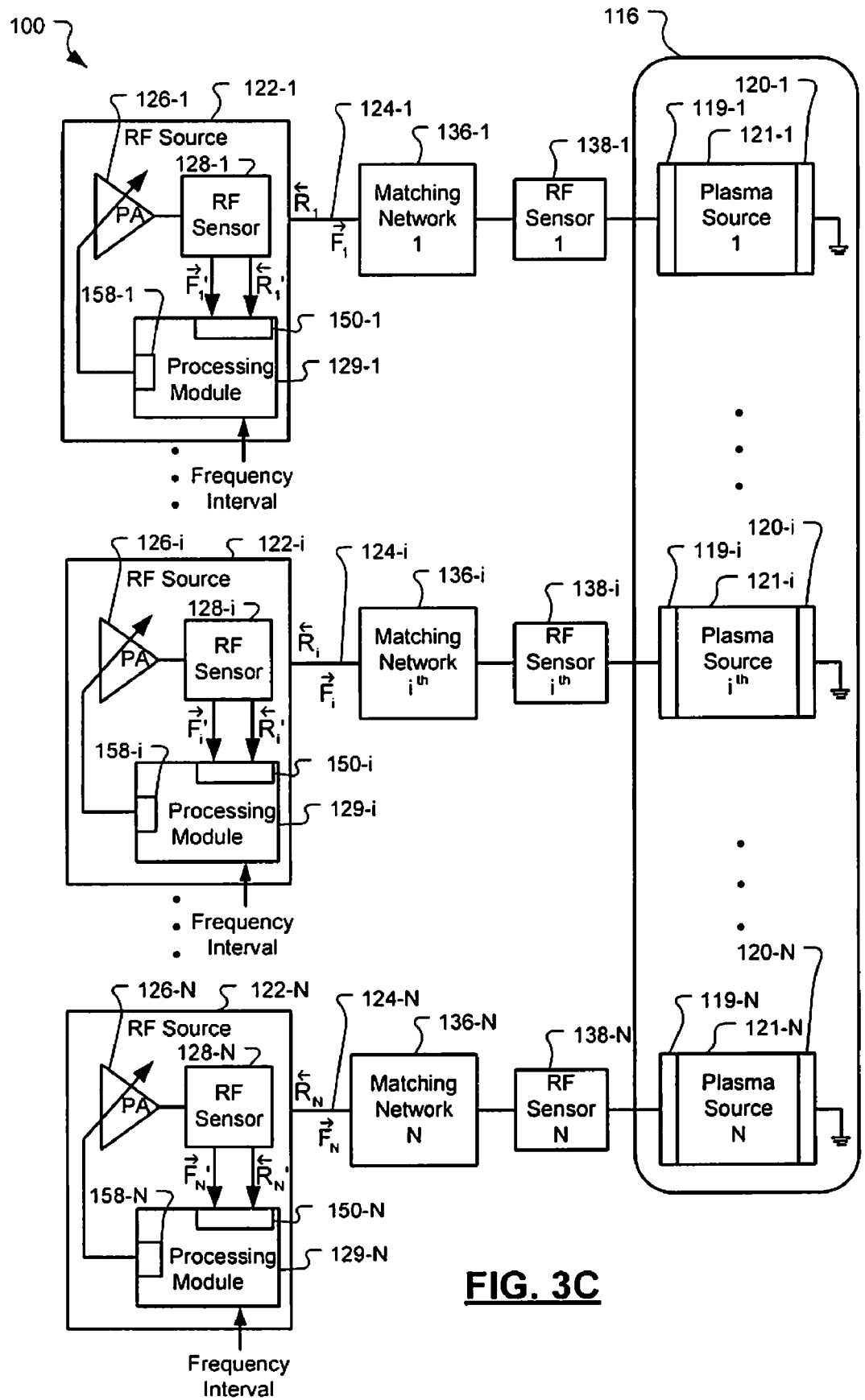

Referring now to FIGS. 3A-3C, a tool 100 may provide RF power to a chamber 116. While FIGS. 3A-3C are illustrated including various features and combinations of components, various other features and combinations of components discussed herein may also be included in any or all of FIGS. 3A-3C. The chamber 116 may enclose electrodes 119-1, ... 119-$i$, ..., and 119-N (referred to as electrodes 119) and electrodes 120-1, ... 120-$i$, ..., and 120-N (referred to as electrodes 120) associated with respective plasma sources 121-1, ..., 121-$i$, ..., and 121-N (referred to as plasma sources 121). The electrodes 119, 120 may share a common vacuum within the chamber 116 and/or a common ground.

The tool 100 may include tunable RF sources 122-1, ... 122-$i$, ..., and 122-N (referred to as RF sources 122) that transmit RF power via transmission lines 124-1, ... 124-$i$, ..., and 124-N (referred to as transmission lines 124). The RF sources 122 may include power amplifiers 126-1, ... 126-$i$, ..., and 126-N (referred to as power amplifiers 126), RF sensors 128-1, ... 128-$i$, ..., and 128-N (referred to as RF sensors 128) and processing modules 129-1, ..., 129-$i$, ..., and 129-N (referred to as processing modules 129). In one embodiment, the processing modules 129 vary the power amplifiers 126 to maintain load power setpoints for each RF source 122. An exemplary processing module 129 includes a proportional-integral-derivative controller (PID controller). The processing modules 129 may be associated with filters that filter distortion, examples of which are discussed later in the present disclosure. It is to be understood that only the primary components of the RF sources 122 are discussed, but that other known components may be needed to implement the RF sources 122.

The RF sources 122 may each be allocated particular operating frequencies. In one embodiment, a tool operator may allocate a predetermined frequency bin in memory 130 for each processing module 129. In another embodiment, a control module 132 may divide up the frequency band for the RF sources 122 and/or allocate a predetermined frequency bin in memory 130 for each RF source. The control module 132 may then assign frequency intervals to each processing module 129.

The RF sources 122 may generate RF power that is output via matching networks 136-1, . . . 136-$i$, . . . , and 136-N (referred to as matching networks 136) to the chamber 116. The matching networks 136 include variable elements that are controlled to match an input impedance of the chamber 116 to an output impedance of the RF sources 122 based on a set point. The variable elements of the matching networks 136 may include electromechanical components or solid-state devices, as in, for example, U.S. Pat. Nos. 5,654,679, 5,473, 291, and U.S. patent application Ser. No. 11/554,979, which are incorporated herein by reference. Electromechanical components may include, but not be limited to, vacuum variable capacitors. The solid-state devices may be capacitor-like tuning elements using semiconductor devices. The number of tuning elements may vary depending on the topology of the matching networks 136.

The transmission lines 124, which may include, for example, one or more 50-Ohm transmission lines, provide power to respective electrodes 119. In one embodiment, first transmission lines provide RF power from the RF sources 122 to the matching networks 136, and second transmission lines provide RF power from the matching networks 136 to the electrodes 119. RF sensors 138-1, . . . 138-$i$, . . . , and 138-N (referred to as RF sensors 138) may communicate with the transmission lines 124 and detect RF power. The RF sensors 138 therefore provide a reading of power reflected from the chamber 116 back towards the RF sources 122 and/or forward power applied to the chamber 116.

The RF sensors 128 of the RF sources 122 may be interposed between the power amplifiers 126 and the matching networks 136 to detect the forward RF power output by the RF source 122 and the reflected RF power from the chamber 116. In one embodiment, the RF sensors 128 include directional sensors having outputs that correspond to detected forward power $\vec{F}$', and received reflected power $\vec{R}$. Therefore, two output signals from the RF sensors 128 may serve as inputs to the processing modules 129. Although sensor signal processing may depend on the particular sensor configuration, it is readily understood that the broader aspects of the processing modules of the present disclosure are applicable to various different types of sensor configurations. For example sensors that generate voltage and/or current signals based on voltage and current signals present on the transmission lines may be used instead of the discussed RF sensors 128.

In one embodiment, a processing module 129 maintains a set point of delivered load power (P) (e.g. $P=\vec{F}'-\vec{R}=\lambda (\vec{F}'-\vec{R})$), where $\lambda$ is a constant. If the reflected power varies from the set point, the processing module 129 may react to drive the power amplifier 126 to regulate load power. If the reflected power includes distortion, the processing module 129 may additionally limit load power based on the distortion. The tool 100 therefore limits distortion through selective allocation and control of operating frequency intervals for the RF sources 122.

Figure 4A:
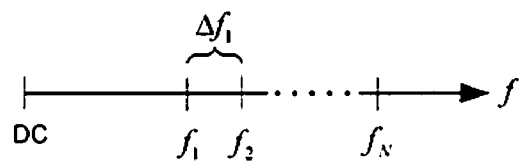
FIGS. 4A-4C are diagrams illustrating frequency allocations, according to the present disclosure.
Figure 4B:
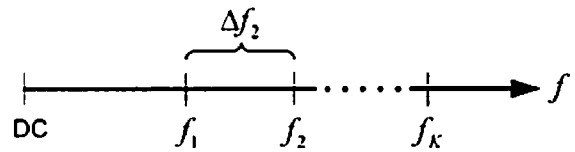
Figure 4C:
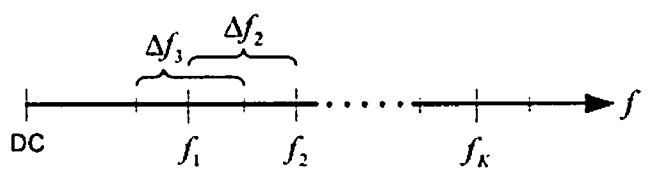

Referring now to FIGS. 4A-4C in view of FIGS. 3A-3C, exemplary diagrams of frequency allocations are illustrated. As in FIG. 4A, the control module 132 may divide up an operating RF band for the RF sources 122 and allocate frequency intervals to each processing module 129. For example, the control module 132 may include an allocation module 140 that segments the RF band into N-1 non-overlapping frequency intervals of length $\Delta f_1$, as in FIG. 4A. The frequency intervals may or may not have uniform lengths. An assignment module 142 may then assign the frequency intervals to the RF sources 122 such that no interval has more than one RF source 122 assigned to it.

In another embodiment, the allocation module 140 may segment the operating RF band for N RF sources 122 into K<N frequency intervals of length $\Delta f_2$, as in FIG. 4B. K<N intervals are used even though N×$\Delta f_2$ may be greater than the length of the useable bandwidth. The length of the frequency intervals may or may not be uniform, and in this embodiment, the frequency intervals may overlap.

The assignment module 142 may assign the same frequency interval to multiple RF sources 122 that communicate with non-neighboring electrodes 119 within the chamber 116. Neighboring electrodes may include electrodes that are immediately adjacent and/or may include electrodes that are less than a threshold distance apart.

In one embodiment, the assignment module 142 may receive signals from the RF sources 122 that indicate their respective target electrodes. The assignment module 142 may determine which of the electrodes are neighboring based on, for example, a plasma chamber map stored in memory 130, and may assign the frequency intervals based on electrode position. The control module 132 may also distribute frequencies of the RF sources over a range greater than the conventional band (e.g. 50 ppm) of non-frequency agile RF sources. The bandwidth may be extended to a predetermined range of +/-X %>>50 ppm.

In one embodiment, as in FIG. 3B, when the same frequency interval is assigned to a set of RF sources 122, the control module 132 may include a phase module 143 that receives signals from the RF sensors 138 for the set of RF sources 122. The phase module 143 may measure the relative phases of each of the corresponding set of RF sources 122 based on the signals and may update respective processing modules 129 with phase set points. The processing modules 129 may then update a phase of output power for the respective RF sources 122 based on the phase set points. For example, the phase module 143 may provide a different phase set point for each RF source that is assigned the same frequency interval.

In other embodiments, RF sources 122 may pulse power output. When RF sources 122 share a frequency interval, the control module 132 may synchronize pulsing times for the RF sources 22. For example, the control module 132 and/or the RF sources 122 may be associated with one or more clocks. The control module 132 may therefore set one or more time intervals for RF sources 122 that share the frequency interval in order to synchronize pulsing. The control module 132 may provide the time interval to the RF sources 122 so that the RF sources 122 pulse in sync.

In another embodiment, as in FIG. 4C, the control module 132 may allocate/assign frequency intervals of length $\Delta f_2$. RF sources 122 that are assigned the frequency intervals of length $\Delta f_2$ may tune over predetermined frequency ranges, e.g. predetermined frequency ranges of length $\Delta f_3$.

The processing modules 129 may also include autotuning modules 144-1, ..., 144-i, ..., and 144-N (referred to as autotuning modules 144) that compute the value of a function. The function may include the ratio of reflected power to forward power, based on values of previous reflected power and/or previous forward power stored in memory 130. The autotuning module 144 may then instruct the processing module 129 to signal the power amplifier 126 to change its frequency by some step value. The autotuning module 144 may therefore optimize power transfer of the RF source 122 beyond the tuning of the variable match of the matching network 136. An exemplary autotuning module 144 is shown in U.S. Pat. No. 6,0120,794, which is incorporated herein by reference. Frequency tuning by the autotuning module 144 and/or the matching network 136 may optimize RF signal transfer from the RF source 122 to the respective electrodes 119.

In one embodiment, the processing modules 129 include narrow band-type filters 150-1, ..., 150-i, ..., and 150-N (referred to as filters 150) that filter detected forward power $\vec{F}$ and/or received reflected power $\vec{R}$. The filters may pass a signal of interest and attenuate the additive spectral components of the received signal. An exemplary filter is shown in U.S. Pat. No. 6,707,255, which is incorporated herein by reference. In operation, the filter 150 limits analog signals within a predefined bandwidth that passes the frequency of interest and rejects the interfering frequency components. Although the frequency of interest may include the fundamental frequency component at the tuned frequency, it is envisioned that the frequency of interest may also include other frequency components that are related to the tuned frequency. The RF sources 122 may tune within the frequency intervals to pass the frequency of interest from a received signal that has been filtered by the filter 150.

In one embodiment, as in FIG. 3C, it may be desirable to "stir" or randomize application of RF power applied to plasma in the chamber 116 in order to provide a relatively uniform deposition of, for example, materials applied to glass. The processing modules 129 may therefore include respective modulation modules 158-1, ..., 158-i, ... and 158-N (referred to as modulation modules 158) that distribute/smear frequencies within the frequency intervals assigned to respective RF sources 122.

The modulation modules 158 may modulate frequencies before they are output to drive the power amplifiers 126. The frequencies may have been processed through filters 150. Exemplary modulation modules 158 may modulate output frequencies using frequency-shift keying (FSK), phase-shift keying (PSK), quadrature phase-shift keying (QPSK), frequency hopping, fast frequency sweeping, and various other pseudorandom or complex frequency modulation techniques. The modulation modules 158 may or may not communicate with each other and may or may not collectively modulate different frequencies for different RF sources 122.

In one embodiment, the matching networks 136 may include a reflection loss that may attenuate intermodulation distortion (IMD) components. IMD components may occur from RF coupling through plasma discharge, which may create the sum and difference spectral components from the various frequencies applied to each electrode 119.

Figure 5A:
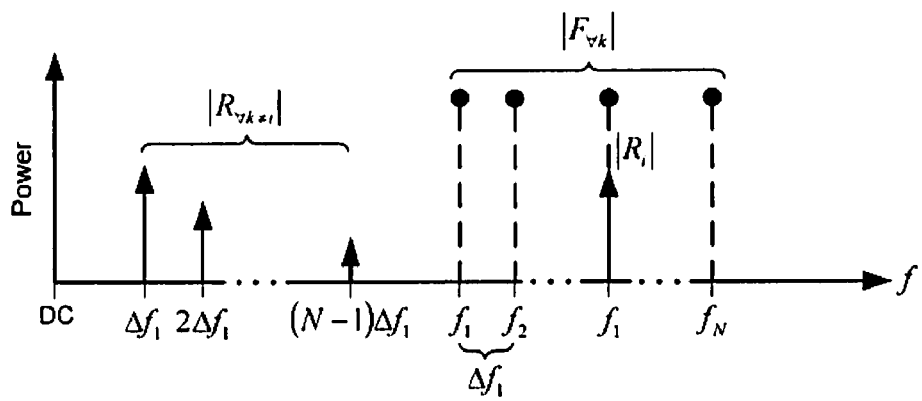
FIGS. 5A-5B are frequency plots illustrating distortion of a received signal, according to the present disclosure.

Referring now to FIG. 5A, a frequency spectrum is illustrated for one embodiment where the control module 132 partitions the operating bandwidth into N-1 intervals and assigns the intervals to the RF sources 122. For the ith source, the IMD components corresponding to the reflected signals are indicated as $R_{\forall k \neq i}$ for a set of difference frequencies. The forward signals ($F_{\forall k}$) correspond to the output of each RF source 122.

As illustrated, the reflected power signals [$R_i$] for the ith RF source is therefore distinguishable from IMD and other distortion. If the matching network 136 has a reflection loss corresponding to the low frequency range of the IMD components ($RR_{\forall k \neq i}$), as seen in FIG. 5A, the IMD components may be attenuated by the matching network 136. The IMD components therefore may not perturb the control scheme associated with the ith RF source. This type of matching network 136 may not be required for embodiments that include digital filtering in the processing of the received/feedback signals by the processing module 129. For example, the filter 150 shown by way of example in U.S. Pat. No. 6,707,255, may be used. In other words, the low frequency range of the IMD components ($R_{\forall k \neq i}$) may simply be filtered out of the received signal.

Figure 5B:
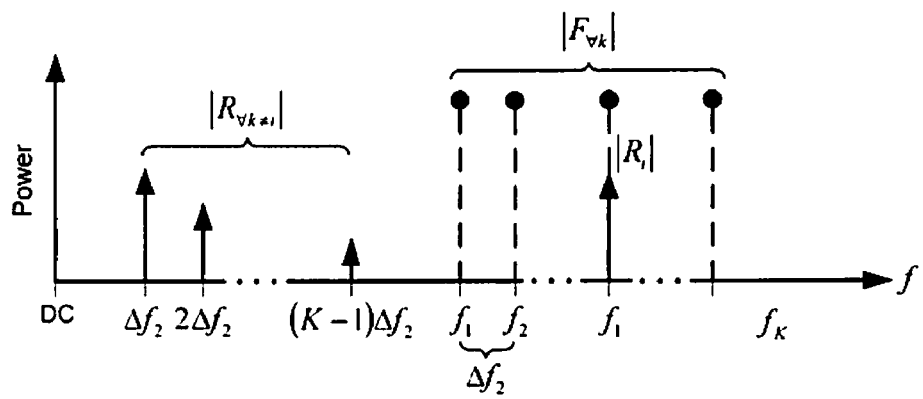

Referring now to FIG. 5B, a frequency spectrum is illustrated for one embodiment where the control module 132 partitions the operating bandwidth into K<N intervals, as in FIG. 4C, and assigns the intervals to the RF sources 122. The frequency intervals of width $\Delta f_2$ may correspond to multiple RF sources 122. However, to avoid EM coupling between plasma sources 121, the assignment module 142 may assign the frequencies to the RF sources 122 so that neighboring electrodes 119 do not contain overlapping frequency intervals, as in the frequency spectrum of FIG. 5B. Frequency intervals defined by $\Delta f_2$ may allow a wide agile-frequency-tuning range of $\Delta f_3$, as in FIG. 4C.

Figure 6:
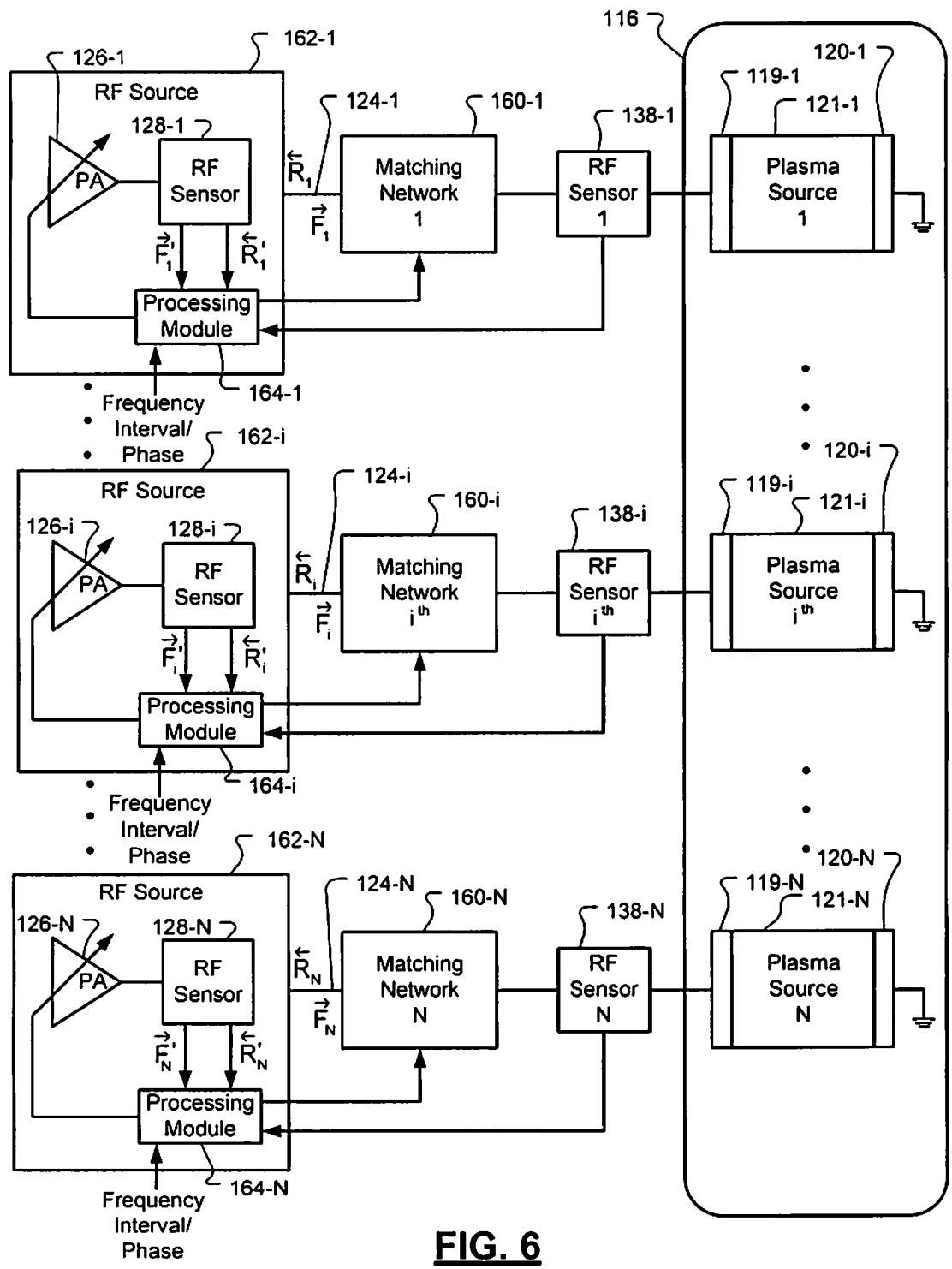
FIG. 6 is a block diagram of an exemplary RF system, according to the present disclosure.

Referring now to FIG. 6, a block diagram of an exemplary RF system is illustrated. In FIG. 6, similar components as those in FIG. 3 are labeled similarly. In one embodiment, the matching networks 160-1, ..., 160-i, ..., and 160-N (referred to as matching networks 160) may have variable elements that are tuned to match the output load impedance and achieve maximum power transfer.

The RF sources 162-1, ..., 162-i, ..., and 162-N (referred to as RF sources 162) may have knowledge of their frequency allocation while also having control objectives to regulate load power via agile frequency variability. The processing modules 164-1, ..., 164-i, ..., and 164-N (referred to as processing modules 164) may therefore provide control signals to the matching networks 160 to control the variable elements in the matching network 160. The control signals effectively localize the control of the RF source 162 and the variable elements of the matching network 160 to a common controller that may provide dynamic system control.

The control signals from the processing modules 164 may be analogous to the partitioning of the frequency band because the processing modules 164 may segment the tuning range of the matching networks 160. For example, one RF source may be configured for frequency setting $f_1$, and a neighboring RF source may have a frequency configuration offset from $f_1$, such as $f_1 + \Delta f_2$. Change in frequency based on frequency interval assignment may adjust the load impedance presented by the plasma source 121 with corresponding impedance shifts between the RF source operating at $f_1$ and the RF source operating at $f_1 + \Delta f_2$. These impedance shifts may require the two respective matching networks for the RF sources to have corresponding set point shifts for their variable elements. The processing modules for the respective RF sources may control the set point shifts.

Prior to turning on RF power, a processing module 164 may configure a matching network 160 with set points associated with plasma ignition. After plasma ignition, the processing module 164 commands the variable elements of the respective matching network 160 to a discharge setting to maximize power transfer. The processing module 164 may adjust the variable elements of the matching network 160 and/or frequency tune to maximize power transfer. The discharge setting can be dynamically configured for different plasma processes or operations (e.g., clean cycles) for distributed control autonomously configured at the RF source 162.

In operation, with reference to FIGS. 3A-3C, the RF sources 122 are turned on, with a frequency at a starting point within predetermined frequency intervals set by the control module 132. The RF sources 122 supply forward power to the plasma chamber 116. A portion of the forward power is reflected back towards the RF sources 122. The reflected power is measured, and the magnitude of reflected power is stored in memory 130 as received signals. The RF sources 122 then change the RF frequency in one direction within their respective frequency intervals. The RF sources 122 again measure reflected power, and compare it with the stored magnitude from the previous measurement. Based on the change in reflected power, the RF sources 122 again move the frequency within the frequency intervals. If there is a decrease in reflected power, the frequency may be moved in the same direction; if there is an increase in reflected power, then the frequency may be moved in the opposite direction. This is continued until a set point for the power, such as the lowest possible reflected power, is achieved.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A radio frequency (RF) system comprising:
 a control module that allocates M predetermined frequency intervals; and
 N RF sources each applying first RF power to electrodes within a plasma chamber at frequencies within an assigned respective one of the M predetermined frequency intervals, and that each respond to second RF power including feedback from the plasma chamber,
 wherein the N RF sources each include a processing module that adjusts the first RF power based on the second RF power and the respective one of the M predetermined frequency intervals, wherein M and N are integers greater than 1.

2. The RF system of claim 1, wherein L of the M predetermined frequency intervals overlap, and wherein L is an integer greater than 1.

3. The RF system of claim 2, wherein the control module assigns members of the L of the M predetermined frequency intervals to members of the N RF sources that communicate with non-neighboring ones of the electrodes.

4. The RF system of claim 1, wherein J of the M predetermined frequency intervals correspond to a same predetermined frequency interval, and wherein J is an integer greater than or equal to 1.

5. The RF system of claim 1, wherein the M predetermined frequency intervals are each a matching length, wherein the M predetermined frequency intervals do not overlap, and wherein M=N.

6. The RF system of claim 1, wherein O of the M predetermined frequency intervals are each a matching length and P of the M predetermined frequency intervals are each different lengths, wherein O and P are integers greater than or equal to 1.

7. The RF system of claim 1, wherein each of the N RF sources includes a narrow band filter that filters interference components of the first RF power and the second RF power before the first RF power and the second RF power are processed in the processing module.

8. The RF system of claim 1, further comprising N matching networks that communicate with the N RF sources, respectively.

9. The RF system of claim 1, further comprising:
 the plasma chamber; and
 N matching networks interposed between the N RF sources and the plasma chamber that match impedances between the N RF sources and the plasma chamber based on signals from the processing modules for each of the N RF sources that control a set point for elements of the N matching networks.

10. The RF system of claim 9, further comprising N sensors positioned between the N matching networks and the plasma chamber that sense the second RF power from the plasma chamber.

11. The RF system of claim 10, wherein the control module further comprises a phase module that selectively provides phases for the frequencies for one or more of the RF sources based on signals from the N sensors.

12. The RF system of claim 1, wherein processing modules for each of the N RF sources include modulation modules that modulate frequencies for RF power output by respective ones of the N RF sources based on at least one of a pseudorandom modulation scheme and a complex frequency modulation scheme.

13. The RF system of claim 12, wherein the modulation modules modulate the frequencies using at least one of frequency-shift keying (FSK), phase-shift keying (PSK), quadrature phase-shift keying (QPSK), frequency hopping and fast frequency sweeping.

14. The RF system of claim 1, wherein the control module synchronizes RF power output pulses of members of the N RF sources that share one of the M predetermined frequency intervals.

15. A radio frequency (RF) system comprising:
 a control module that allocates M predetermined frequency intervals;
 a first tunable RF source that maintains a first set point for delivered load power at a first frequency based on first power delivered to a first electrode in a load, first feedback reflected from the load, and an assigned first of the M predetermined frequency intervals; and
 a second tunable RF source that maintains a second set point for delivered load power at a second frequency based on second power delivered to a second electrode in the load, second feedback reflected from the load, and an assigned second of the M predetermined frequency intervals,
 wherein M is an integer greater than 1.

16. The RF system of claim 15, wherein the first and second of the M predetermined frequency intervals overlap, and wherein the first electrode does not neighbor the second electrode within the load.

17. The RF system of claim 15, wherein the M predetermined frequency intervals are each a matching length, wherein the M predetermined frequency intervals do not overlap, and wherein M=N.

18. The RF system of claim 15, a third tunable RF source that maintains a third set point for delivered load power at a third frequency based on third power delivered to a third electrode in the load, third feedback reflected from the load, and a third of the M predetermined frequency intervals.

19. The RF system of claim 18, wherein the first and third of the M predetermined frequency intervals correspond to a matching predetermined frequency interval, and the first and second of the M predetermined frequency intervals correspond to different intervals, and wherein the first and third electrodes are non-neighboring electrodes, and wherein the first electrode neighbors the second electrode within the load.

20. The RF system of claim 15, wherein O of the M predetermined frequency intervals are each a matching length and P of the M predetermined frequency intervals are each different lengths, wherein O and P are integers greater than or equal to 1.

21. The RF system of claim 15, wherein the first tunable RF source includes a narrow band filter that filters interference components within the first feedback reflected from the load caused by the second power from the second tunable RF source.

22. The RF system of claim 15, further comprising a first matching network that communicates with the first tunable RF source and the load, and a second matching network that communicates with the second tunable RF source and the load.

23. The RF system of claim 15, wherein the first matching network matches impedances between the first tunable RF source and the load based on signals from the first tunable RF source that control a set point for elements of the first matching network.

24. The RF system of claim 23, further comprising a sensor positioned between the first matching network and the load that senses the first and second RF power, wherein the control module further comprises a phase module that selectively provides phases for the frequencies for one or more of the first and second tunable RF sources based on signals from the sensor.

25. The RF system of claim 15, wherein the first tunable RF source includes a modulation module that modulates frequencies for RF power output from the first tunable RF source based on at least one of a pseudorandom modulation scheme and a complex frequency modulation scheme.

26. The RF system of claim 25, wherein the modulation module modulates the frequencies using at least one of frequency-shift keying (FSK), phase-shift keying (PSK), quadrature phase-shift keying (QPSK), frequency hopping and fast frequency sweeping.

27. The RF system of claim 25, wherein the control module synchronizes RF power output pulses for the first tunable RF source and the second tunable RF source when the first tunable RF source shares one of the M predetermined frequency intervals with the second tunable RF source.

28. The RF system of claim 15, further comprising the load, wherein the load includes a plasma chamber.

29. A method for operating a radio frequency (RF) system comprising:
   allocating M predetermined frequency intervals;
   applying N first RF power outputs to electrodes within a plasma chamber each at frequencies within an assigned respective one of the M predetermined frequency intervals;
   receiving feedback from the plasma chamber; and
   adjusting the N first RF power outputs based on the feedback and the respective one of the M predetermined frequency intervals, wherein M and N are integers greater than 1.

30. The method of claim 29, wherein L of the M predetermined frequency intervals overlap, and wherein L is an integer greater than 1.

31. The method of claim 30, further comprising assigning members of the L of the M predetermined frequency intervals to members of the N first RF power outputs that communicate with non-neighboring ones of the electrodes.

32. The method of claim 29, wherein J of the M predetermined frequency intervals correspond to the same predetermined frequency interval, and wherein J is an integer greater than or equal to 1.

33. The method of claim 29, wherein the M predetermined frequency intervals are each a matching length, wherein the M predetermined frequency intervals do not overlap, and wherein M=N.

34. The method of claim 29, wherein O of the M predetermined frequency intervals are each a matching length and P of the M predetermined frequency intervals are each different lengths, wherein O and P are integers greater than or equal to 1.

35. The method of claim 29, further comprising selectively providing phases for the frequencies for one or more RF sources for the N RF power outputs.

36. The method of claim 29, further comprising modulating frequencies for members of the N RF power outputs based on at least one of a pseudorandom modulation scheme and a complex frequency modulation scheme.

37. The method of claim 29, further comprising synchronizing pulses for members of the N RF power outputs that share one of the M predetermined frequency intervals.

38. A method for operating a radio frequency (RF) system comprising:
   allocating M predetermined frequency intervals;
   actively maintaining a first set point for delivered load power at a first frequency based on first power delivered to a first electrode in a load, first feedback from the load, and an assigned first of the M predetermined frequency intervals; and
   actively maintaining a second set point for delivered load power at a second frequency based on second power delivered to a second electrode in the load, second feedback from the load, and an assigned second of the M predetermined frequency intervals,
   wherein M is an integer greater than 1.

39. The method of claim 38, wherein the first and second of the M predetermined frequency intervals overlap, and wherein the first electrode does not neighbor the second electrode within the load.

40. The method of claim 38, wherein the M predetermined frequency intervals are each a matching length, wherein the M predetermined frequency intervals do not overlap, and wherein M=N.

41. The method of claim 38, further comprising actively maintaining a third set point for delivered load power at a third frequency based on third power delivered to a third electrode in the load, third feedback from the load, and a third of the M predetermined frequency intervals.

42. The method of claim 41, wherein the first and third of the M predetermined frequency intervals correspond to the same predetermined frequency interval and the first and second of the M predetermined frequency intervals correspond to different intervals, and wherein the first and third electrodes are non-neighboring electrodes, and wherein the first electrode neighbors the second electrode within the load.

43. The method of claim 38, wherein O of the M predetermined frequency intervals are each a matching length and P of the M predetermined frequency intervals are each different lengths, wherein O and P are integers greater than or equal to 1.

44. The method of claim 38, further comprising selectively providing phases for the first and second frequencies.

45. The method of claim 38, further comprising modulating the first and second frequencies based on at least one of a pseudorandom modulation scheme and a complex frequency modulation scheme.

46. The method of claim 38, further comprising synchronizing pulses for the first power and the second power.

* * * * *